United States Patent
Araragi (10) Patent No.: US 10,823,768 B2
(45) Date of Patent: Nov. 3, 2020

(54) OVERCURRENT DETECTION CIRCUIT FOR SWITCHES

(71) Applicant: DENSO CORPORATION, Kariya (JP)

(72) Inventor: Akifumi Araragi, Kariya (JP)

(73) Assignee: DENSO CORPORATION, Kariya (JP)

( * ) Notice: Subject to any disclaimer, the term of this patent is extended or adjusted under 35 U.S.C. 154(b) by 34 days.

(21) Appl. No.: 16/367,794

(22) Filed: Mar. 28, 2019

(65) Prior Publication Data

US 2019/0310290 A1 Oct. 10, 2019

(30) Foreign Application Priority Data

Apr. 4, 2018 (JP) .................................. 2018-072151

(51) Int. Cl.
| | | |
|---|---|---|
| *G01R 19/165* | (2006.01) | |
| *H02M 7/219* | (2006.01) | |
| *H03K 17/08* | (2006.01) | |
| *H02M 1/00* | (2006.01) | |

(52) U.S. Cl.
CPC ...... *G01R 19/16528* (2013.01); *H02M 7/219* (2013.01); *H03K 17/08* (2013.01); *H02M 2001/0009* (2013.01)

(58) Field of Classification Search
CPC .. G01R 15/183; G01R 29/26; G01R 19/0084; G01R 17/02
See application file for complete search history.

(56) References Cited

U.S. PATENT DOCUMENTS

| | | | | |
|---|---|---|---|---|
| 7,504,840 B2* | 3/2009 | Arat | .................... | G01R 1/06733 |
| | | | | 324/755.05 |
| 2002/0017914 A1* | 2/2002 | Roggel | .............. | G01R 1/06738 |
| | | | | 324/754.2 |
| 2006/0022689 A1* | 2/2006 | Golden | .............. | G01R 31/2886 |
| | | | | 324/754.04 |

FOREIGN PATENT DOCUMENTS

JP 2015-104208 A 6/2015

* cited by examiner

*Primary Examiner* — Giovanni Astacio-Oquendo
(74) *Attorney, Agent, or Firm* — Oliff PLC

(57) ABSTRACT

In an overcurrent detection circuit for switches parallely connected to each other, sense detectors are respectively provided for the switches. Each of the sense detectors detects a sense voltage of the corresponding one of the switches. The sense voltage of each of the switches is based on a sense current associated with a current flowing through the corresponding one of the switches. A parameter calculator calculates, based on the sense voltages calculated by the respective sense detectors, a determination parameter that is less subject to imbalance between currents flowing through the respective switches. A determiner determines whether a value of the determination parameter is higher than an overcurrent threshold, and determines that there is an overcurrent flowing through at least one of the switches upon determining that the value of the determination parameter is higher than the overcurrent threshold.

8 Claims, 9 Drawing Sheets

OVERCURRENT DETECTION CIRCUIT FOR SWITCHES

CROSS REFERENCE TO RELATED APPLICATION

This application is based on and claims the benefit of priority from Japanese Patent Application No. 2018-072151 filed on Apr. 4, 2018, the disclosure of which is incorporated in their entireties herein by reference.

TECHNICAL FIELD

The present disclosure relates to overcurrent detection circuits for switches.

BACKGROUND

For example, an overcurrent detection circuit for parallely-connected switches, such as IGBTs, is known. Such an overcurrent detection circuit is configured to determine whether at least one of sense voltages for the respective switches is higher than a predetermined overcurrent threshold.

SUMMARY

There is an overcurrent detection circuit for a plurality of switches parallely connected to each other according to an exemplary embodiment of the present disclosure. The overcurrent detection circuit includes a parameter calculator configured to calculate, based on sense voltages calculated by respective sense detectors, a determination parameter that is less subject to imbalance between currents flowing through the respective switches. The overcurrent detection circuit includes a determiner configured to determine whether a value of the determination parameter is higher than an overcurrent threshold; and determine that there is an overcurrent flowing through at least one of the switches upon determining that the value of the determination parameter is higher than the overcurrent threshold.

BRIEF DESCRIPTION OF THE DRAWINGS

Other aspects of the present disclosure will become apparent from the following description of embodiments with reference to the accompanying drawings in which.

DETAILED DESCRIPTION OF EMBODIMENT

INVENTOR'S VIEWPOINT

Japanese Patent Application Publication No. 2015-104208 discloses such an overcurrent detection circuit for parallely-connected switches, such as IGBTs. Specifically, the overcurrent detection circuit disclosed in the published patent document includes sense detectors and a determiner. The sense detectors are provided for the respective switches. Each of the sense detectors detects a sense voltage depending on a minute current that flows from the corresponding one of the switches; the minute current correlates with a current flowing through the corresponding one of the switches.

The determiner is configured to determine whether at least one of the sense voltages for the respective switches is higher than a predetermined overcurrent threshold, and determine that an overcurrent is flowing through the at least one of the switches corresponding the at least one of the sense voltages upon determining that the at least one of the sense voltages is higher than the predetermined overcurrent threshold.

These switches usually have the same specifications. Unfortunately, there are variations in currents flowing through respective on-state switches due to, for example, their individual differences. The current variations are called a current imbalance. A current imbalance may cause a specific current to flow through at least one on-state switch included in the on-state switches. The specific current has a value higher than an average value obtained by dividing the sum of the currents flowing through all the on-state switches by the number of the on-state switches. This may result in the at least one on-state switch being erroneously determined as a switch through which an overcurrent is flowing.

For addressing such an erroneous determination, while a current, that is not an overcurrent, is individually flowing through each of the parallely-connected switches, it is necessary to set the value of the highest current in all the currents as the overcurrent threshold.

This unfortunately may make it difficult to determine that an overcurrent is flowing through at least one switch unless an actual current value through the at least one switch is higher than the overcurrent threshold that is set to the highest current. This may result in the reliability of the at least one switch deteriorating.

From this viewpoint, one aspect of the present disclosure seeks to provide overcurrent detection circuits for switches, each of which is capable of preventing deterioration of the reliability of each switch.

According to a first exemplary aspect of the present disclosure, there is provided an overcurrent detection circuit for a plurality of switches parallely connected to each other.

The overcurrent detection circuit includes a plurality of sense detectors respectively provided for the switches. Each of the sense detectors is configured to detect a sense voltage of the corresponding one of the switches. The sense voltage of each of the switches is based on a sense current associated with a current flowing through the corresponding one of the switches. The overcurrent detection circuit includes a parameter calculator configured to calculate, based on the sense voltages calculated by the respective sense detectors, a determination parameter that is less subject to imbalance between currents flowing through the respective switches. The overcurrent detection circuit includes a determiner configured to determine whether a value of the determination parameter is higher than an overcurrent threshold; and determine that there is an overcurrent flowing through at least one of the switches upon determining that the value of the determination parameter is higher than the overcurrent threshold.

According to a second exemplary aspect of the present disclosure, there is provided a drive circuit for a plurality of switches parallely connected to each other and each having a control terminal. The drive circuit includes a charging and discharging unit configured to charge the control terminals of the switches to thereby cause the switches to be turned on, and discharge the control terminals of the switches to cause the switches to be turned off. The drive circuit includes a plurality of sense detectors respectively provided for the switches. Each of the sense detectors is configured to detect a sense voltage of the corresponding one of the switches. The sense voltage of each of the switches is based on a sense current associated with a current flowing through the corresponding one of the switches. The drive circuit includes a parameter calculator configured to calculate, based on the sense voltages calculated by the respective sense detectors, a determination parameter that is less subject to imbalance between currents flowing through the respective switches. The drive circuit includes a determiner configured to determine whether a value of the determination parameter is higher than an overcurrent threshold during the switches being on, and determine that there is an overcurrent flowing through at least one of the switches upon determining that the value of the determination parameter is higher than the overcurrent threshold. The drive circuit includes a fail-safe unit configured to discharge the control terminal of each of the switches upon it being determined that there is an overcurrent flowing through at least one of the switches due to it being determined that the value of the determination parameter is higher than the overcurrent threshold.

The determination parameter being less subject to imbalance between the currents flowing through the respective switches of each of the first and second exemplary aspects enables the overcurrent threshold to be set smaller as compared with a case where a determination parameter is affected by the imbalance between the currents flowing through the respective switches. This therefore lowers an actual current value flowing through one of the switches at the timing when the value of the determination parameter is higher than the overcurrent threshold, thus preventing a reduction in the reliability of one of the switches.

Embodiment

The following describes embodiments of the present disclosure with reference to the accompanying drawings. In the embodiments, like parts between the embodiments, to which like reference characters are assigned, are omitted or simplified to avoid redundant description.

First Embodiment

The following describes the first embodiment of the present disclosure with reference to FIGS. 1 to 5. The first embodiment shows, for example, an overcurrent detection circuit as a component of a control system CS for a rotary electric machine 30.

Figure 1:
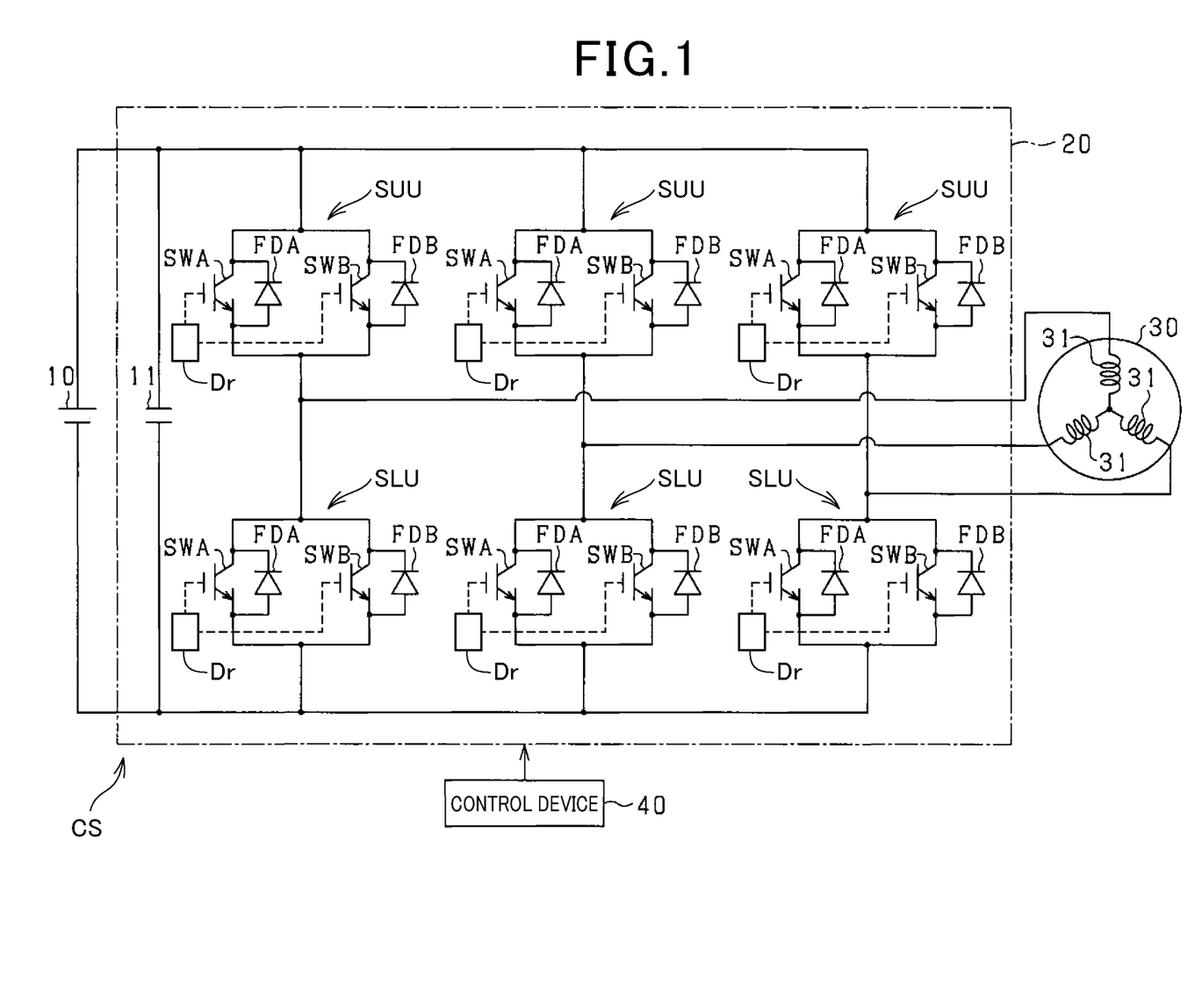
FIG. 1 is a circuit diagram schematically illustrating an example of the overall structure of a control system for a rotary electric machine according to the first embodiment of the present disclosure.

Referring to FIG. 1, the control system CS includes a battery 10 serving as a direct-current (DC) power source, an inverter 20 serving as a power converter, the rotary electric machine 30, and a control device 40.

The rotary electric machine 30 is electrically connected to the battery 10 via the inverter 20. The first embodiment uses a permanent magnet synchronous three-phase rotary electric machine as the rotary electric machine 30. In particular, the rotary electric machine 30 includes a rotor having permanent magnets, and a stator having a stator core and three-phase stator coils 31. In particular, the rotary electric machine 30 is capable of rotating the rotor having the permanent magnets based on magnetic interactions between the permanent magnets of the rotor and a rotating magnetic field generated by the three-phase stator coils 31 of the stator. Each of the three-phase stator coils 31 has opposing first and second ends. The stator can be configured such that each of the three-phase stator coils 31 is wound in and around the stator core in concentrated or distributed configuration.

The control system CS also includes a smoothing capacitor 11, which is comprised of first and second electrodes located to face each other, connected in parallel to the battery 10 and located between the battery 10 and the inverter 20.

The inverter 20 includes three (UVW)-phase upper- and lower-arm switch units SUU and SLU. The upper-arm switch unit SUU for each phase is comprised of a first switch SWA and a second switch SWB connected in parallel to each other, and similarly the lower-arm switch unit SLU is comprised of a first switch SWA and a second switch SWB connected in parallel to each other.

Each of the first and second switches SWA and SWB of the upper-arm switch unit SUU for each phase has high- and low-side terminals, and each of the first and second switches SWA and SWB of the lower-arm switch unit SLU for each phase also has high- and low-side terminals.

The high-side terminals of the first and second switches SWA and SWB of the upper-arm switch unit SUU for each phase provide a common high-side terminal, and the common high-side terminal of the upper-arm switch units SUU is connected to the first electrode of the smoothing capacitor 11.

The high-side terminals of the first and second switches SWA and SWB of the lower-arm switch unit SLU for each phase also provide a common high-side terminal.

The low-side terminals of the first and second switches SWA and SWB of the upper-arm switch unit SUU for each phase provide a common low-side terminal, and the common low-side terminal of the upper-arm switch units SUU is connected to the common high-side terminal of the lower-arm switch units SLU.

The low-side terminals of the first and second switches SWA and SWB of the lower-arm switch unit SLU for each phase provide a common low-side terminal, and the common low-side terminal of the lower-arm switch units SLU is connected to the second electrode of the smoothing capacitor 11.

The connection point between the upper- and lower-arm switch units SUU and SLU for the U-phase is connected to the first end of the U-phase stator coil 31. Similarly, the connection point between the upper- and lower-arm switch units SUU and SLU for the V-phase is connected to the first end of the V-phase stator coil 31, and the connection point between the upper- and lower-arm switch units SUU and SLU for the W-phase is connected to the first end of the W-phase stator coil 31. The second ends of the U-, V-, and W-phase coils 31 are connected to a common junction, i.e. a neutral point, in, for example, a star-configuration.

The first embodiment uses voltage-controlled semiconductor switches, more specifically uses Si IGBTs, for the respective switches SWA and SWB. That is, the high-side terminal of each of the first and second switches SWA and SWB is the collector, and the low-side terminal of each of the first and second switches SWA and SWB is the emitter. Each upper-arm switch unit includes first and second flyback, i.e. free-wheeling, diodes FDA and FDB connected in antiparallel to the respective first and second switches SWA and SWB. Similarly, each lower-arm switch unit includes first and second flyback, i.e. free-wheeling, diodes FDA and FDB connected in antiparallel to the respective first and second switches SWA and SWB.

The inverter 20 also includes drive circuits Dr provided for the respective switch units SUU and SLU. Each drive circuit Dr is operative to turn on or off the corresponding switches SWA and SWB of the corresponding switch unit under control of the control device 40.

The control device 40 causes each drive circuit Dr to alternately turn on (1) The set of the first and second switches SWA and SWB of the upper-arm switch unit SUU of each phase (2) The set of the first and second switches SWA and SWB of the lower-arm switch unit SLU of the corresponding phase This switching operations of the switches SWA and SWB cause a controlled variable, such as torque, of the rotary electric machine 30 to match with a commanded value or a requested value.

Specifically, the control device 40 cyclically generates, as a drive signal G for each switch unit, an on command or an off command, and cyclically sends the on command or off command of the drive signal G to each drive circuit Dr of the corresponding switch unit; the on command has a logical high level (H), and instructs each drive circuit Dr to turn on the first and second switches SWA and SWB of the corresponding switch unit, and the off command has a logical low level (L), and instructs each drive circuit Dr to turn off the first and second switches SWA and SWB of the corresponding switch unit.

Each drive circuit Dr receives the corresponding drive signal G, and turns on or off the first and second switches SWA and SWB of the corresponding switch unit in accordance with the corresponding drive signal G. In particular, each drive circuit Dr according to the first embodiment synchronously turns on or off the first and second switches SWA and SWB of the corresponding switch unit in accordance with the corresponding drive signal G.

Figure 2:
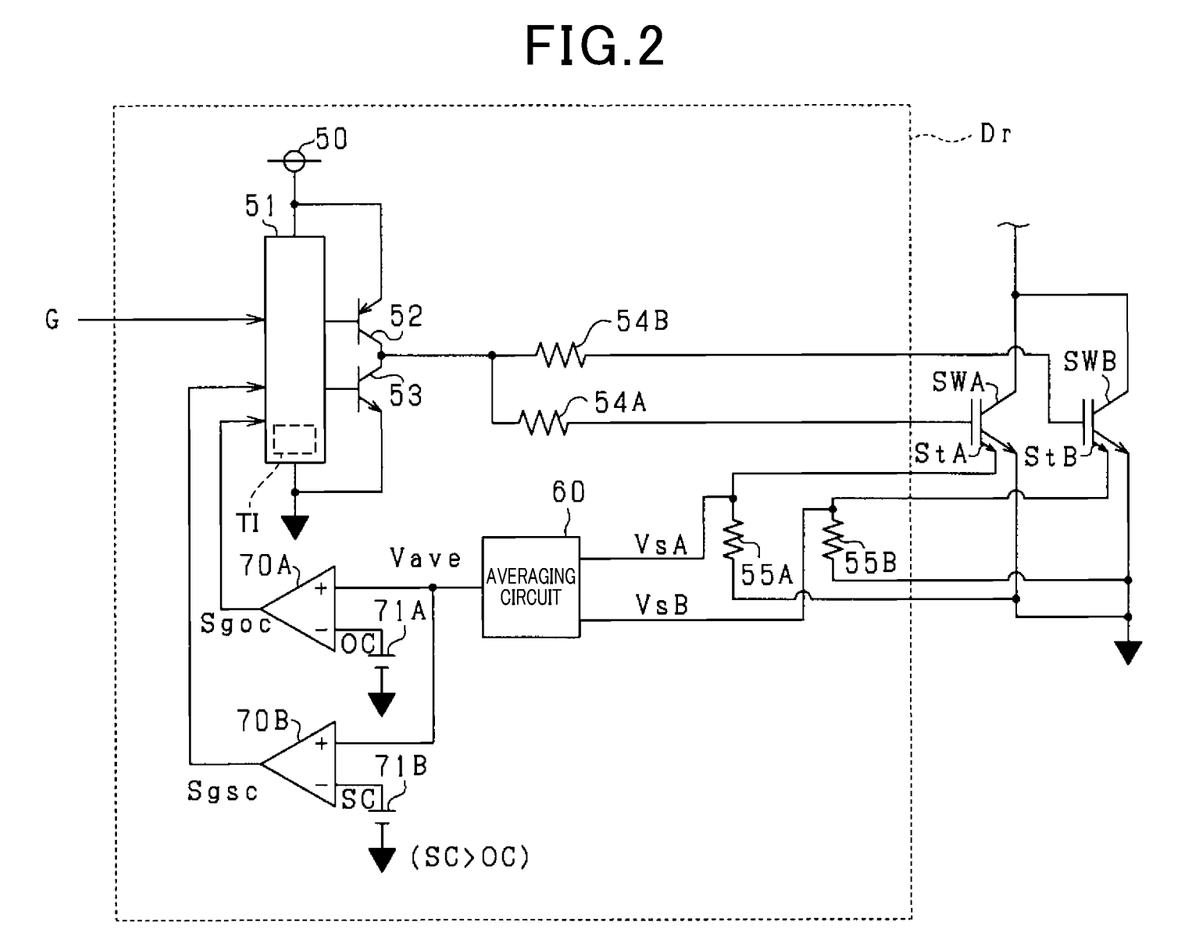
FIG. 2 is a circuit diagram schematically illustrating an example of the structure of a drive circuit for each switch unit illustrated in FIG. 1.

Next, the following describes an example of the structure of each drive circuit Dr for the corresponding switch unit with reference to FIG. 2. The drive circuits Dr for the respective switch units SUU and SLU basically have a common structure. For this reason, the following describes the structure of the drive circuit Dr for the U-phase upper-arm switch unit SUU as a typical example.

Referring to FIG. 2, the drive circuit Dr includes a constant voltage source 50, a drive controller 51, a charge switch 52, a discharge switch 53, a first gate resistor 54A, and a second gate resistor 54B. The drive circuit Dr also includes a first sense resistor 55A, a second sense resistor 55B, an averaging circuit 60, a first comparator 70A, a second comparator 70B, a first power source 71A, and a second power source 71B.

The first embodiment uses a PNP transistor as the charge switch 52, and uses an NPN transistor as the discharge switch 53.

Each of the resistors 54A, 54B, 55A, and 55B has opposing first and second ends.

The constant voltage source 50 is connected to the emitter of the charge switch 52, and the collector of the charge switch 52 is connected to the first end of each of the first and second resistors 54A and 54B. The gate of the first switch SWA is connected to the second end of the first resistor 54A, and the gate of the second switch SWB is connected to the second end of the second resistor 54B.

The collector of the discharge switch 53 is connected to the first end of each of the charge and discharge switches 52 and 53. The emitter of the discharge switch 53 is connected to the emitter of each of the first and second switches SWA and SWB via a common signal ground.

The first switch SWA has a first sense terminal StA through which a minute current, i.e. a sense current, flows; the sense current is associated with a collector current flowing through the first switch SWA. The first sense terminal StA is connected to the first end of the first sense resistor 55A, and the second end of the first sense resistor 55A is connected to the emitter of the first switch SWA via the common signal ground.

When the sense current flows through the first sense terminal StA and the first sense resistor 55A, a voltage drop across the first sense resistor 55A occurs. Thus, a voltage at the first end of the first sense resistor 55A, which will be referred to as a first sense voltage VsA, relative to the potential at the emitter of the first switch SWA serves as, for example, an electric state parameter correlating with the magnitude of the collector current flowing through the first switch SWA. The potential at the emitter of the first switch SWA is set to zero, and, when the potential at the first end of the first sense resistor 55A is higher than the emitter potential, the first sense voltage VsA is defined to have a positive potential. The first end of the first sense resistor 55A is connected to the averaging circuit 60, so that the first sense voltage VsA is supplied to the averaging circuit 60. Note that the first sense resistor 55A serves as, for example, a sense detector provided for the first switch SWA.

Similarly, the second switch SWB has a second sense terminal StB through which a minute current, i.e. a sense current, flows; the sense current is associated with a collector current flowing through the second switch SWB. The second sense terminal StB is connected to the first end of the second sense resistor 55B, and the second end of the second sense resistor 55B is connected to the emitter of the second switch SWB via the common signal ground.

When the sense current flows through the second sense terminal StB and the second sense resistor 55B, a voltage drop across the second sense resistor 55B occurs. Thus, a voltage at the first end of the second sense resistor 55B, which will be referred to as a second sense voltage VsB, relative to the potential at the emitter of the second switch SWB serves as, for example, an electric state parameter correlating with the magnitude of the collector current flowing through the second switch SWB. The potential at the emitter of the second switch SWB is set to zero, and, when the potential at the first end of the second sense resistor 55B is higher than the emitter potential, the second sense voltage VsB is defined to have a positive potential. The first end of the second sense resistor 55B is connected to the averaging circuit 60, so that the second sense voltage VsB is supplied to the averaging circuit 60. Note that the second sense resistor 55B serves as, for example, a sense detector provided for the second switch SWB.

As described above, the first sense voltage VsA and the second sense voltage VsB are input to the averaging circuit 60.

The averaging circuit 60 is configured to calculate an average of the first sense voltage VsA and the second sense voltage VsB as a sense average Vave. The sense average Vave corresponds to, for example, a determination voltage. The averaging circuit 60 according to the first embodiment performs arithmetic average of the first and second sense voltages VsA and VsB to thereby calculate the sense average Vave in accordance with the following equation: Vave= (VsA+VsB)/2. That is, the averaging circuit 60 calculates the sum of the first and second sense voltages VsA and VsB, and divides the sum of the first and second sense voltages VsA and VsB by the number of the sense voltages VsA and VsB, i.e. 2, thus calculating the sense average Vave.

Each of the first and second comparators 70A and 70B has a non-inverting input terminal, an inverting input terminal, and an output terminal.

The sense average Vave is sent from the averaging circuit 60 to the non-inverting input terminal of each of the first and second comparators 70A and 70B. To the inverting input terminal of the first comparator 70A, an output voltage of the first power source 71A is input as an overcurrent threshold OC that is set to a limit sense voltage of the first switch SWA generated when a rated current for each of the first and second switches SWA and SWB flows through the first switch SWA.

Similarly, to the inverting input terminal of the second comparator 70B, an output voltage of the second power source 71B is input as a short-circuit threshold SC that is set to a voltage value higher than the overcurrent threshold OC.

The first comparator 70A is configured to compare the first sense voltage VsA with the overcurrent threshold OC, and output an output signal Sgoc having (1) A logical low level (L) when the first sense voltage VsA is lower than the overcurrent threshold OC, or (2) A logical high level (H) when the first sense voltage VsA is equal to or higher than the overcurrent threshold OC The output signal Sgoc of the first comparator 70A is sent from the first comparator 70A to the drive controller 51.

Similarly, the second comparator 70B is configured to compare the second sense voltage VsB with the short-circuit threshold SC, and output an output signal Sgsc having (1) The logical low level when the second sense voltage VsB is lower than the short-circuit threshold SC, or (2) The logical high level when the second sense voltage VsB is equal to or higher than the short-circuit threshold SC The output signal Sgsc of the second comparator 70B is sent from the second comparator 70B to the drive controller 51. The drive controller 50 is configured to control on-off switching operations of each of the first to third switches T1, T2, and T3 in accordance with the gate drive voltage G for the target switch SW from the controller 100.

The drive controller 51 operates based on the output voltage supplied from the constant voltage source. The drive controller 51 includes, for example, a hardware or software timer TI for counting time.

The drive controller 51 is configured to control on-off switching operations of each of the charge and discharge switches 52 and 53 in accordance with the drive signal G sent from the control device 40. The drive controller 51 is comprised of, for example, a computer including a processor, such as a CPU, a memory, and a peripheral circuit. At least part of all functions provided by the drive controller 51 can be implemented by at least one processor; the at least one processor can be comprised of (1) The combination of at least one programmed processing unit, i.e. at least one programmed logic circuit, and at least one memory including software that causes the at least one programed logic circuit to implement all the functions (2) At least one hardwired logic circuit that implements all the functions (3) At least one hardwired-logic and programmed-logic hybrid circuit that implements all the functions The drive controller 51 determines whether the drive signal G sent from the control device 40 is the on command or off command.

When determining that the drive signal G sent from the control device 40 is the on command, the drive controller 51 performs a charging task to thereby turn on the charge switch 52 while turning off the discharge switch 53. This charging task causes the constant voltage source 50 to output a charging current to the gate of each of the first and second switches SWA and SWB via the corresponding one of the first and second gate resistors 54A and 54B, resulting in a gate voltage at each of the first and second switches SWA and SWB rising up to be equal to or higher than a threshold voltage Vth. This results in each of the first and second switches SWA and SWB being synchronously switched from the off state to the on state, enabling a current to flow from the collector to emitter of the corresponding one of the first and second switches SWA and SWB.

Otherwise, when determining that the drive signal G sent from the control device 40 is the off command, the drive controller 51 performs a discharging task to thereby turn off the charge switch 52 while turning on the discharge switch 53. This discharging task causes the gate of each of the first and second switches SWA and SWB to be connected to the common signal ground via the discharge switch 53, causing a discharge current to flow from the gate of each of the first and second switches SWA and SWB to the common signal ground. This results in the gate voltage at each of the first and second switches SWA and SWB dropping to be lower than the threshold voltage Vth. This results in each of the first and second switches SWA and SWB being synchronously switched from the on state to the off state.

While the first and second switches SWA and SWB are in the on state, there may be a current imbalance between the first and second switches SWA and SWB even if the first and second switches SWA and SWB have the same specifications; the current imbalance represents that the collector current flowing through the first switch SWA is unequal to the collector current flowing through the second switch SWB.

For example, even if the designed on-resistance of the first switch SWA is set to be identical to the designed on-resistance of the second switch SWB, an actual on resistance of the first switch SWA may be different from an actual on resistance of the second switch SWB due to, for example, their individual differences. This may cause the current imbalance between the first and second switches SWA and SWB.

The current imbalance between the first and second switches SWA and SWB may cause a current, which is higher than a reference current, to flow through one of the first and second switches SWA and SWB; the reference current represents a current value obtained by dividing, in half, the total value of the collector currents flowing through the respective first and second switches SWA and SWB.

Figure 3:
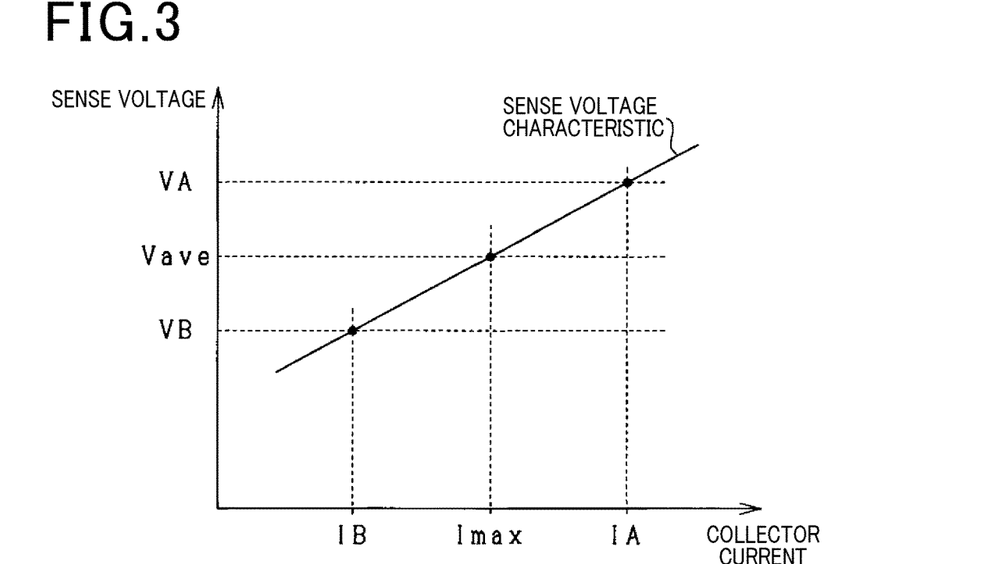
FIG. 3 is a graph schematically illustrating how a current imbalance is caused.

FIG. 3 schematically illustrates a case where (1) The collector current flowing through the first switch SWA, which will be referred to as ISA, is larger than the collector current flowing through the second switch SWB, which will be referred to as ISB (2) The sum of the collector currents ISA and ISB becomes a maximum value Imax Note that the maximum value Imax can be obtained by, for example, multiplying the rated current for each of the switches SWA and SWB by 2.

FIG. 3 also schematically illustrates, as reference character VA, a value of the first sense voltage VsA, which corresponds to a value IA of the collector current flowing through the first switch SWA, and also illustrates, as reference character VB, a value of the second sense voltage VsB, which corresponds to a value IB of the collector current flowing through the second switch SWB.

Under the situation where the sum of the collector currents flowing through the respective switches SWA and SWB is equal to or less than the product of 2 and the maximum value Imax, setting the overcurrent threshold OC to a value higher than the value VA od the first sense voltage VsA is required for preventing erroneous determination that an overcurrent is flowing through the first switch SWA.

Unfortunately, this setting would make it difficult to determine that an overcurrent is flowing through the first switch SWA unless the actually measured value of the first sense voltage VsA is higher than the overcurrent threshold OC that is set to the maximum value Imax. This would result in the reliability of the first switch SWA deteriorating.

From this viewpoint, the drive circuit Dr is provided with the averaging circuit 60 that calculates the sum of the first and second sense voltages VsA and VsB, and divides the sum of the first and second sense voltages VsA and VsB in half, thus calculating the sense average Vave. This enables the sense average Vave to be set to the overcurrent threshold OC lower than the conventional overcurrent threshold of the value VA (see FIG. 3), resulting in reduction of the adverse effects of the current imbalance.

Next, the following describes a method of determining whether there is an overcurrent or a short-circuit fault associated with the first and second switches SWA and SWB. Note that, as described above, the overcurrent for example represents a situation where a current flowing through at least one of the first and second switches is higher than the overcurrent threshold OC. In addition, the short-circuit fault for example represents a situation where a current flowing through at least one of the first and second switches is higher than the short-circuit threshold SC due to an upper- and lower-arm short-circuit in which the upper- and lower-arm switch units for the same phase are simultaneously on.

Figure 4A:
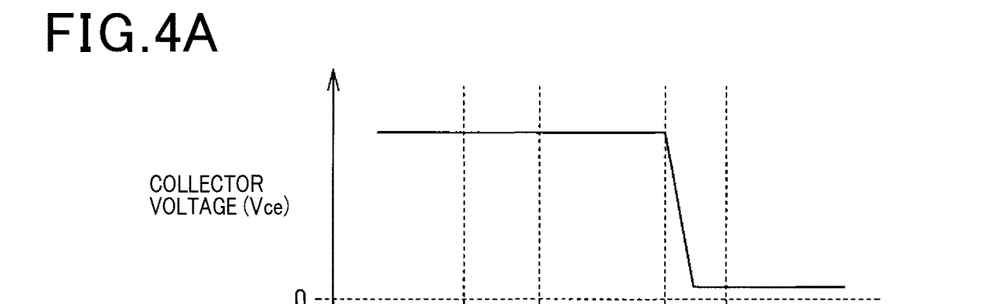
FIGS. 4A to 4C are a joint timing chart schematically illustrating how a collector-emitter voltage of each switch, a drive signal, and a sense voltage of each switch are respectively changed over time.
Figure 4B:
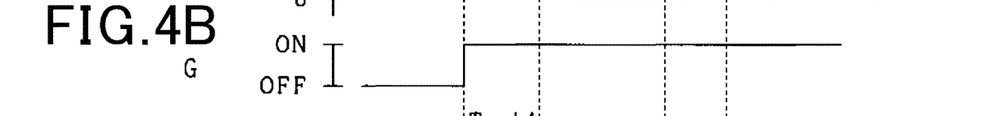
Figure 4C:
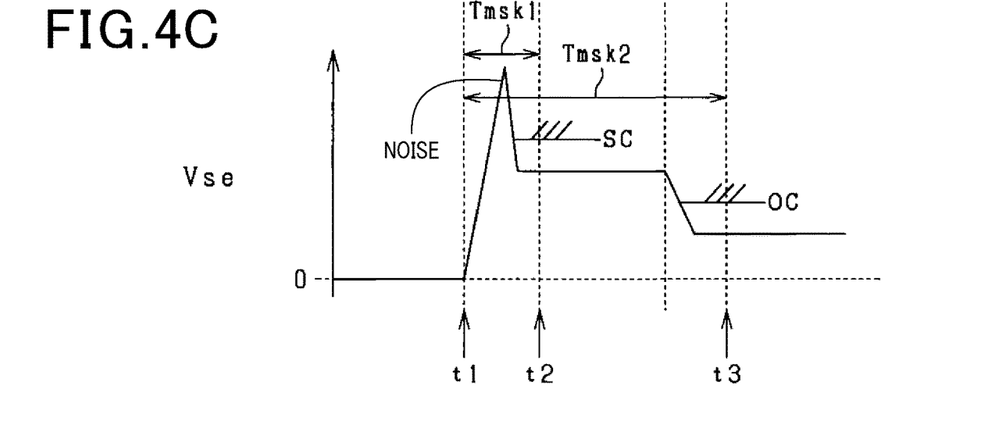

FIG. 4A schematically illustrates how a collector-emitter voltage of each of the first and second switches SWA and SWB, which is simply referred to as a collector voltage Vce, is changed over time, FIG. 4B schematically illustrates how the drive signal G input to the drive controller 51 is changed over time, and FIG. 4C schematically illustrates how each of the first and second sense voltages VsA and VsB, which is simply referred to as Vse in FIG. 4C, is changed over time. Note that FIGS. 4A to 4C illustrate a situation where there are no overcurrent and short-circuit faults in the first and second switches SWA and SWB.

The drive controller 51 deter mines, during the drive signal G being the on command, whether the output signal Sgsc of the second comparator 70B is the logical high level at time t2 when a first mask period Tmsk1 has elapsed since time t 1 when the drive signal G was switched to the on command. When determining that the output signal Sgsc of the second comparator 70B is the logical high level at the time t2, the drive controller 51 determines that a short-circuit fault associated with the first and second switches SWA and SWB has occurred.

The following describes the reason why the drive controller 51 determines whether the output signal Sgsc of the second comparator 70B is the logical high level at time t2 when the first mask period Tmsk1 has elapsed since the time t1.

Specifically, when the first and second switches SWA and SWB are switched from the off state to the on state at the time t1, a noise signal may be temporarily superimposed on at least one of the first and second sense voltages VsA and VsB due to, for example, recovery of the corresponding at least one of the flyback diodes FDA and FDB. From this viewpoint, the drive controller 51 determines whether the output signal Sgsc of the second comparator 70B is the logical high level after lapse of the first mask period Tmsk1 since the time t1; the first mask period Tmsk 1 is sufficient time required for the temporality superimposed noise to disappear in the at least one of the first and second sense voltages VsA and VsB. This therefore makes it possible to prevent erroneous determination of the occurrence of a short-circuit fault due to the noise signal.

Additionally, the drive controller 51 determines, during the drive signal G being the on command, whether the output signal Sgoc of the first comparator 70A is the logical high level at time t3 when a second mask period Tmsk2 has elapsed since the time t1 when the drive signal G was switched to the on command. When determining that the output signal Sgoc of the first comparator 70A is the logical high level at the time t3, the drive controller 51 determines that there is an overcurrent flowing through at least one of the first and second switches SWA and SWB.

The second mask period Tmsk2 is defined to prevent the drive controller 51 from performing the determination of whether the output signal Sgoc of the first comparator 70A is the logical high level for a predetermined period, i.e. a Miller period, during which the collector voltage Vce of each of the first and second switches SWA and SWB transitions from the off level to the on level. Note that the Miller period of each of the first and second switches SWA and SWB represents a period during which a gate voltage of the corresponding switch remains at a predetermined constant voltage, i.e. a Miller voltage, while the collector voltage rises during the charging task of the corresponding switch.

Figure 5:
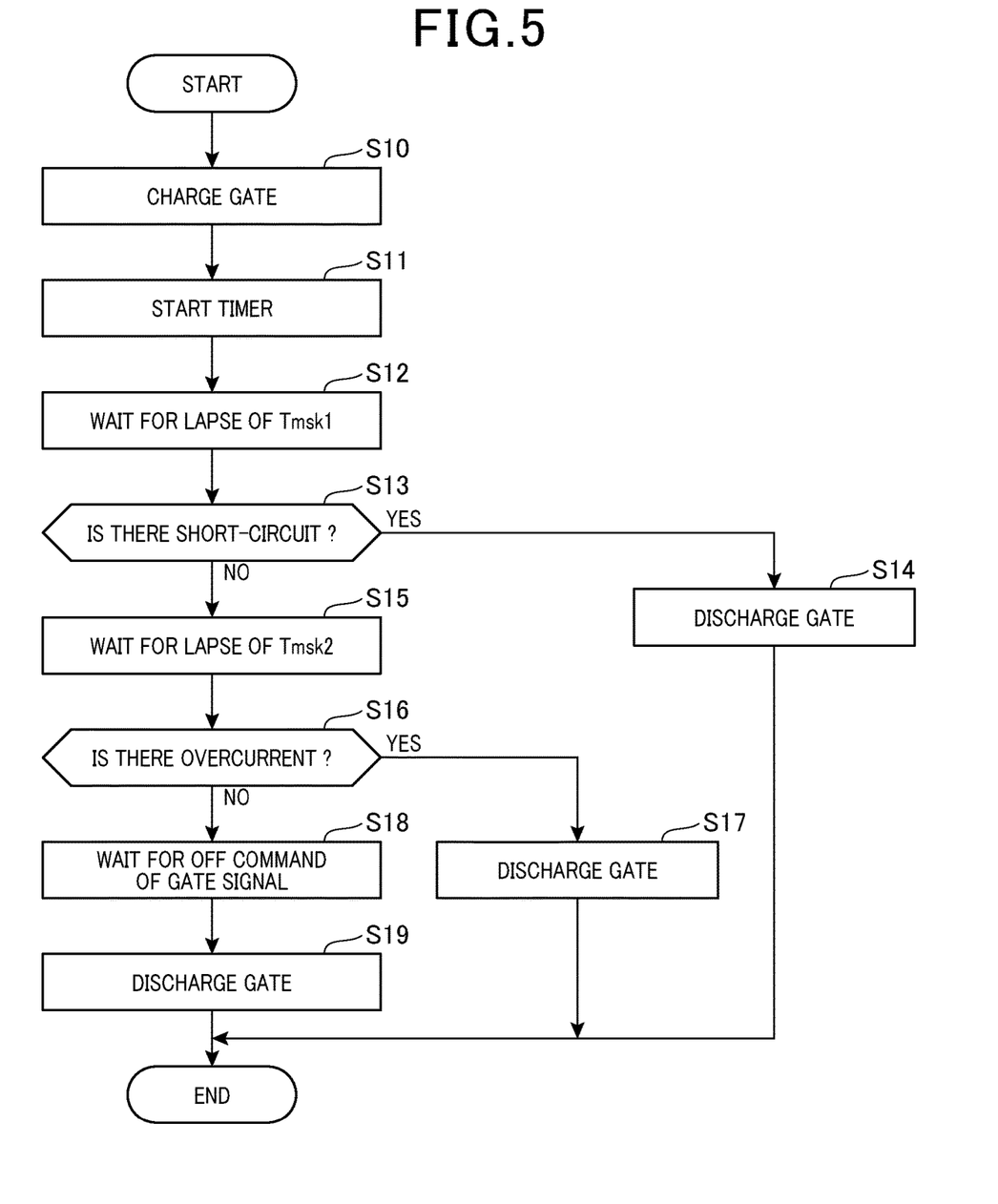
FIG. 5 is a flowchart schematically illustrating a switch control routine carried out by a drive controller illustrated in FIG. 2.

The following describes a switch control routine carried out by the drive controller 51 serving as, for example, a determiner each time the drive signal G is switched from the off command to the on command with reference to FIG. 5.

When starting the switch control routine, the drive controller 51 performs the charging task in response to the drive signal G being switched from the off state to the on state to thereby supply the charging current to each of the first and second switches SWA and SWB in step S10.

Next, the drive controller 51 uses the timer TI to start counting of elapsed time from an initial count value of zero since the drive signal G being switched from the off command to the on command in step S11. Following the operation in step S11, the drive controller 51 waits for lapse of the first mask period Tmsk1 since the drive signal G being switched from the off command to the on command in step S12. That is, in step S12, the drive controller 51 determines whether the counted elapsed time has reached the first mask period Tmsk1, in other words, whether the first mask period Tmsk 1 has elapsed since the drive signal G being switched from the off command to the on command.

When determining that the first mask period Tmsk 1 has elapsed since the drive signal G being switched from the off command to the on command, the drive controller 51 determines whether the output signal Sgsc of the second comparator 70B is the logical high level in step S13. When determining that the output signal Sgsc of the second comparator 70B is the logical high level (YES in step S13), the drive controller 51 determines that there is a short-circuit fault associated with the first and second switches SWA and SWB. Then, the drive controller 51 performs the discharging task to thereby cause the discharging current to be discharged from the gate of each of the first and second switches SWA and SWB in step S14, thus turning off each of the first and second switches SWA and SWB. Thereafter, the drive controller 51 terminates the switch control routine.

Otherwise, when determining that the output signal Sgsc of the second comparator 70B is not the logical high level, i.e. is the logical low level (NO in step S13), the drive controller 51 determines that there are no short-circuit faults associated with the first and second switches SWA and SWB. Then, the drive controller 51 waits for lapse of the second mask period Tmsk2 since the drive signal G being switched from the off command to the on command in step S15. That is, in step S15, the drive controller 51 determines whether the counted elapsed time has reached the second mask period Tmsk2, in other words, whether the second mask period Tmsk2 has elapsed since the drive signal G being switched from the off command to the on command.

When determining that the second mask period Tmsk2 has elapsed since the drive signal G being switched from the off command to the on command, the drive controller 51 determines whether the output signal Sgoc of the first comparator 70A is the logical high level in step S16. When determining that the output signal Sgoc of the first comparator 70A is the logical high level (YES in step S16), the drive controller 51 determines that there is an overcurrent flowing through one of the first and second switches SWA and SWB. Then, the drive controller 51 performs the discharging task to thereby cause the discharging current to be discharged from the gate of each of the first and second switches SWA and SWB in step S17, thus turning off each of the first and second switches SWA and SWB. Thereafter, the drive controller 51 terminates the switch control routine. The operation in at least one of steps S14 and S17 by the drive controller 51 serves as, for example, a fail-safe unit.

Otherwise, when determining that the output signal Sgoc of the first comparator 70A is not the logical high level, i.e. is the logical low level (NO in step S16), the drive controller 51 determines that there is no overcurrent flowing through each of the first and second switches SWA and SWB. Then, the drive controller 51 waits for the drive signal G being switched from the on command to the off command in step S18.

When the drive signal G being switched from the on command to the off command, the drive controller 51 performs the discharging task, thus turning off each of the first and second switches SWA and SWB in step S19.

As described above, the drive circuit Dr according to the first embodiment is configured to calculate the average of the first sense voltage VsA and the second sense voltage VsB as the sense average Vave. Then, the drive circuit Dr uses the sense average Vave as a parameter indicative of a criterion of determination of whether there is an overcurrent flowing through one of the first and second switches SWA and SWB; the sense average Vave serves as, for example, a parameter that is less subject to, i.e. is less affected by, the current imbalance.

This configuration enables the sense average Vave to be set as the overcurrent threshold OC that is smaller than the conventional overcurrent threshold set forth above. This therefore lowers an actual current value flowing through one of the first and second switches SWA and SWB at the timing when the logical level of the output signal of the first comparator 70A is changed from the logical low level to the logical high level, thus preventing a reduction in the reliability of one of the first and second switches SWA and SWB.

The drive circuit Dr according to the first embodiment is also configured such that the first and second comparators 70A and 70B, which are used to perform the overcurrent determination and the short-circuit fault determination, are shared by the first and second switches SWA and SWB.

Second Embodiment

Figure 6:
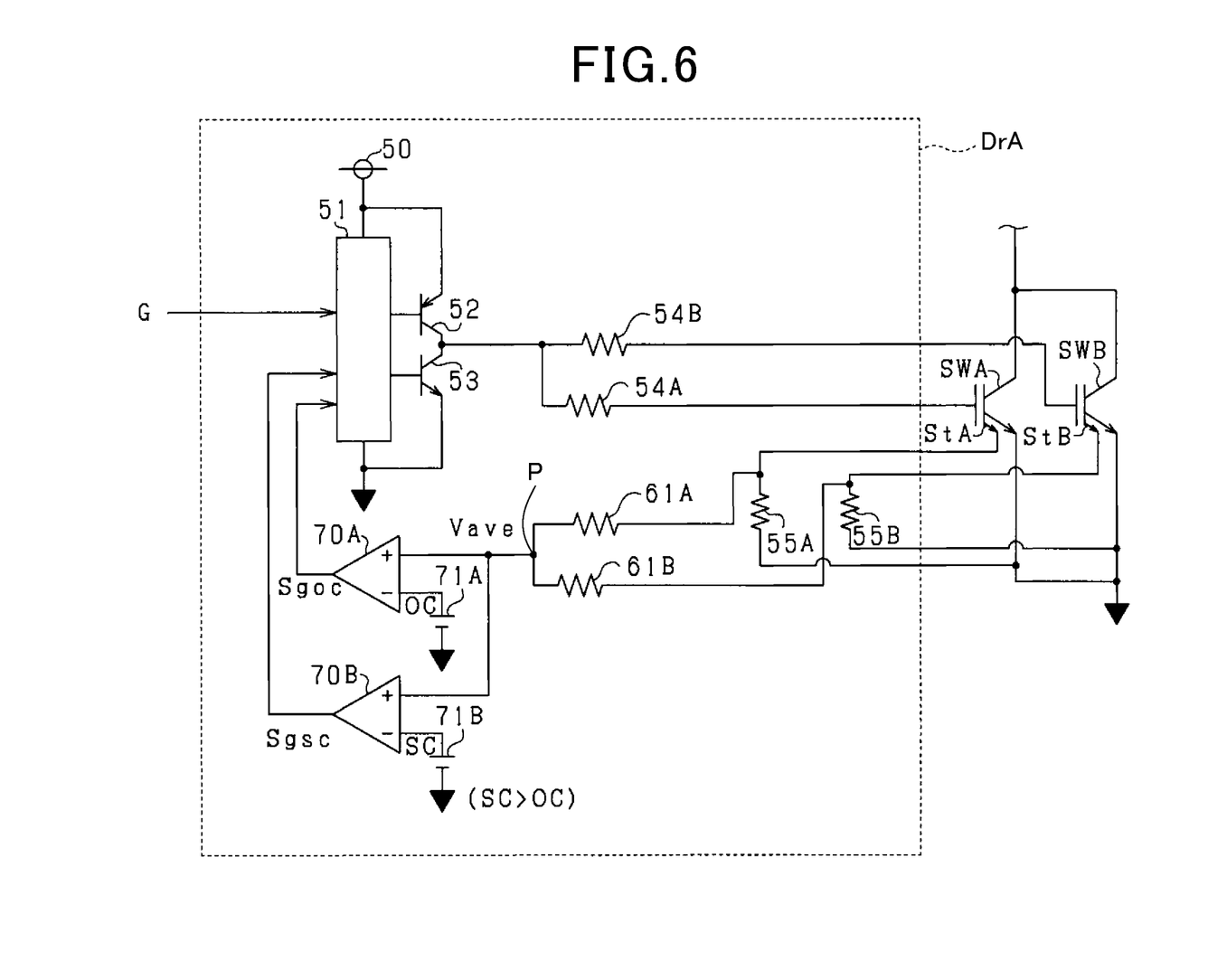
FIG. 6 is a circuit diagram schematically illustrating an example of the structure of a drive circuit for each switch unit according to the second embodiment of the present disclosure.

The following describes the second embodiment of the present disclosure with reference to FIG. 6. FIG. 6 schematically illustrates each drive circuit DrA according to the second embodiment. The structures and/or functions of the drive circuit DrA according to the second embodiment are different from those of the drive circuit Dr according to the first embodiment by the following points. So, the following mainly describes the different points, and omits or simplifies descriptions of like parts between the first and second embodiments, to which identical or like reference characters are assigned, thus eliminating redundant description.

The drive circuit DrA includes a first averaging resistor 61A and a second averaging resistor 61B in place of the averaging circuit 60. Each of the first and second averaging resistors 61A and 61B serves as, for example, a determination voltage generator.

Each of the first and second averaging resistors 61A and 61B has opposing first and second ends. The first end of the first averaging resistor 61A is connected to the first end of the first sense resistor 55A, and the first end of the second averaging resistor 61B is connected to the first end of the second sense resistor 55B. The second end of each of the first and second averaging resistors 61A and 61B is connected to the non-inverting input terminal of the first comparator 70A, and also connected to the non-inverting input terminal of the second comparator 70B.

The first averaging resistor 61A has a resistance RA, and the second averaging resistor 61B has a resistance RB that is set to be identical to the resistance RA.

The first and second averaging resistors 61A and 61B therefore divide the sum of the first and second sense voltages VsA and VsB in half, thus calculating the sense average Vave. This is because the voltage Vp at the common second end (see reference character P in FIG. 6) of the first and second resistors 61A and 61B can be expressed by the following equation:

$$Vp=(VsA+VsB)\times\{RA/(RA+RB)\}=(VsA+VsB)/2$$

The voltage Vp is the product of the sum of the first and second sense voltages VsA and VsB and a predetermine resistance ratio of RA/(RA+RB) among the resistances RA and RB.

That is, the set of the first and second averaging resistors 61A and 61B enables the sense average Vave to be output to the non-inverting input terminal of each of the first and second comparators 70A and 70B.

Note that the structure of the drive circuit DrA provides a closed circuit including the first sense terminal StA, the first averaging resistor 61A, the second averaging resistor 61B, and the second sense terminal StB. If a current flowing through the closed circuit were high, the calculated sense average Vave might include a large error. For addressing such an error, each of the resistances RA and RB of the first and second averaging resistors 61A and 61B is preferably set to be larger than the resistance of the corresponding one of the first and second sense resistors 55A and 55B. Specifically, each of the resistances RA and RB of the first and second averaging resistors 61A and 61B can be set to be at least ten times more than the resistance of the corresponding one of the first and second sense resistors 55A and 55B. More specifically, each of the resistances RA and RB of the first and second averaging resistors 61A and 61B can be set to be at least 1000 times more than the resistance of the corresponding one of the first and second sense resistors 55A and 55B.

The drive circuit DrA according to the second embodiment obtains the same technical effects as those obtained by the drive circuit Dr according to the first embodiment while having a simpler configuration as comparted with the configuration of the drive circuit Dr.

Modification of the Second Embodiment

The resistance RA of the first averaging resistor 61A can be set to be different from the resistance RB of the second averaging resistor 61B. This modification obtains the sense average Vave in the following equation:

$$Vave=(VsA+VsB)\times\{RA/(RA+RB)\}$$

That is, the first and second averaging resistors 61A and 61B averages the first and second sense voltages VsA and VsB to an intermediate value between the first and second sense voltages VsA and VsB other than the value (VsA+VsB)/2.

That is, this modification enables the sense average Vave to be closer to the value (VsA+VsB)/2 than the first sense voltage VsA or the second sense voltage VsB is.

Third Embodiment

Figure 7:
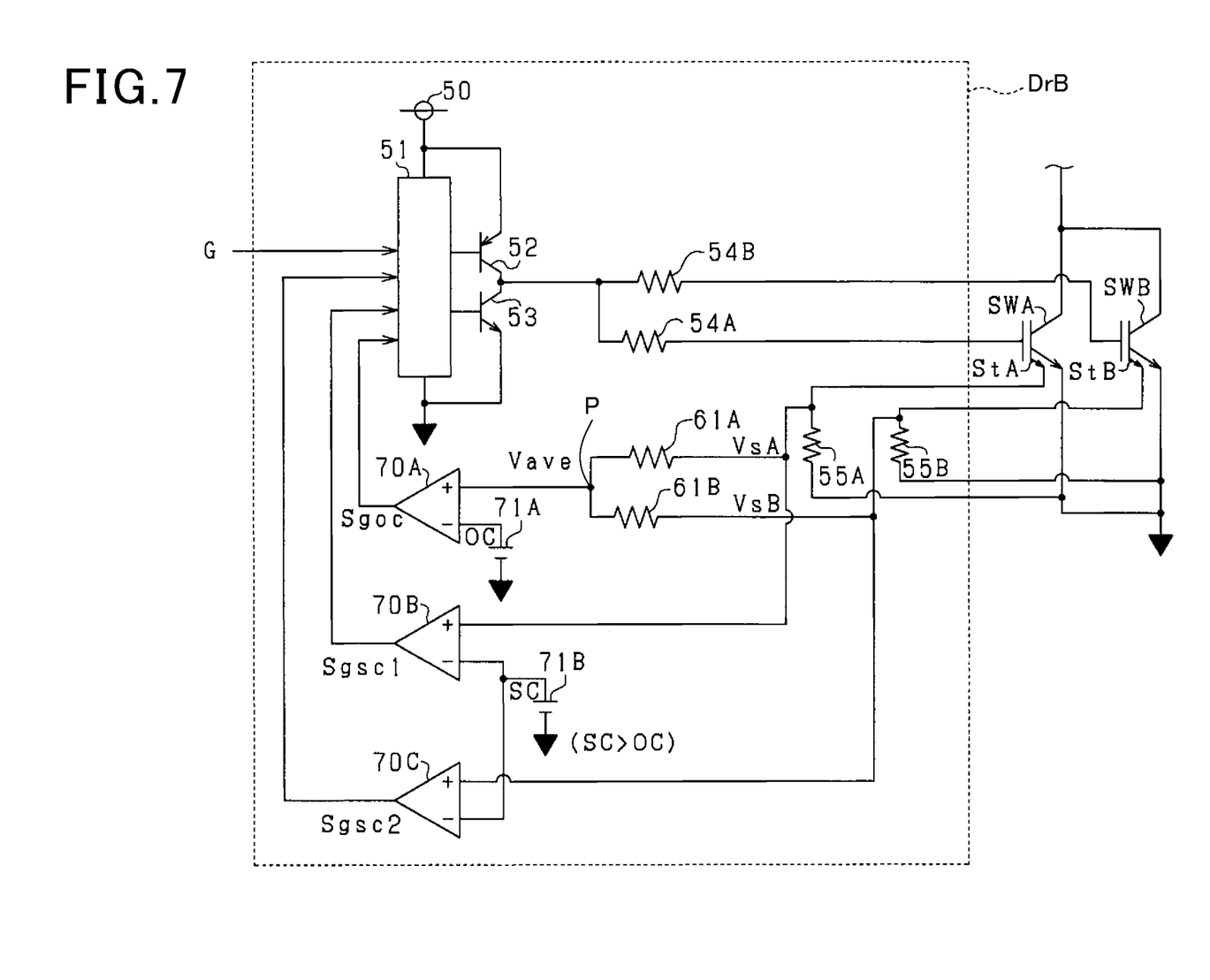
FIG. 7 is a circuit diagram schematically illustrating an example of the structure of a drive circuit for each switch unit according to the third embodiment of the present disclosure.

The following describes the third embodiment of the present disclosure with reference to FIG. 7. FIG. 7 schematically illustrates each drive circuit DrB according to the third embodiment. The structures and/or functions of the drive circuit DrB according to the third embodiment are different from those of the drive circuit DrA according to the second embodiment by the following points. So, the following mainly describes the different points, and omits or simplifies descriptions of like parts between the second and third embodiments, to which identical or like reference characters are assigned, thus eliminating redundant description.

The drive circuit DrB is configured such that the first end of the first sense resistor 55A is connected to the non-inverting input terminal of the second comparator 70B in addition to the first end of the first averaging resistor 61A and to the sense terminal StA of the first switch SWA.

That is, the second comparator 70B of the third embodiment is configured to compare the first sense voltage VsA with the short-circuit threshold SC, and output an output signal Sgsc1 having (1) The logical low level when the first sense voltage VsA is lower than the short-circuit threshold SC, or (2) The logical high level when the first sense voltage VsA is equal to or higher than the short-circuit threshold SC The output signal Sgsc 1 of the second comparator 70B is sent from the second comparator 70B to the drive controller 51.

The drive circuit DrB includes a third comparator 70C having a non-inverting input terminal, an inverting input terminal, and an output terminal. The first end of the second sense resistor 55B is connected to the non-inverting input terminal of the third comparator 70C in addition to the first end of the second averaging resistor 61B and to the sense terminal StB of the second switch SWB. The output voltage of the second power source 71B is input as the short-circuit threshold SC to the inverting input terminal of the third comparator 70C, which is similar to the second comparator 70B.

That is, the third comparator 70C of the third embodiment is configured to compare the second sense voltage VsB with the short-circuit threshold SC, and output an output signal Sgsc2 having (1) The logical low level when the second sense voltage VsB is lower than the short-circuit threshold SC, or (2) The logical high level when the second sense voltage VsB is equal to or higher than the short-circuit threshold SC The output signal Sgsc2 of the third comparator 70C is sent from the third comparator 70C to the drive controller 51.

The drive controller 51 of the third embodiment is basically configured to perform the switch control routine except for the following different points. Thus, the following describes the different points.

Specifically, in step S13, the drive controller 51 is configured to determine whether at least one of the following first and second conditions is satisfied:

The first condition is that the output signal Sgsc1 of the second comparator 70B is the logical high level The second condition is that the output signal Sgsc2 of the third comparator 70C is the logical high level Upon determining that at least one of the first and second conditions is satisfied (YES in step S13), the drive controller 51 performs the operation in step S14. Otherwise, upon determining that neither the first condition nor the second condition are satisfied (NO in step S13), the drive controller 51 performs the operation in step S15.

Figure 8:
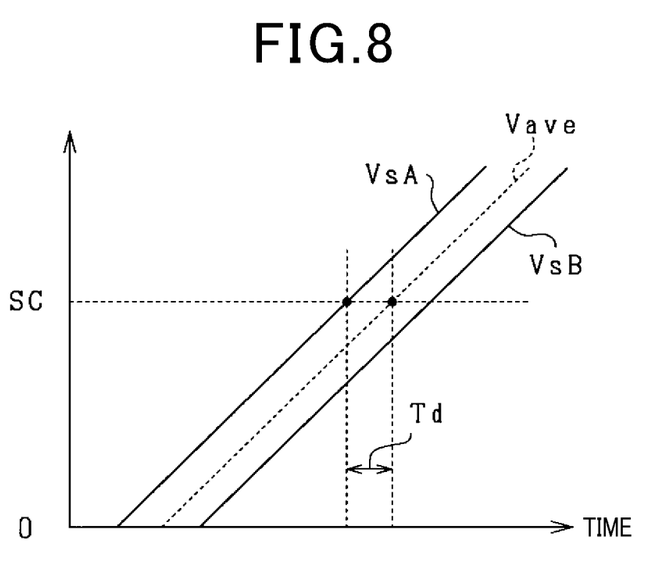
FIG. 8 is a graph schematically illustrating a technical benefit obtained by the third embodiment.

The following describes, with reference to FIG. 8, an additional benefit obtained by the drive circuit DrB according to the third embodiment as compared with the benefits obtained by the drive circuit DrA according to the second embodiment.

FIG. 8 is a graph schematically illustrating how each of the first sense voltage VsA, the second sense voltage VsB, and the sense average Vave are changed over time while there is a current imbalance between the collector current flowing through the first switch SWA and the collector current flowing through the second switch SWB that is lower than the collector current following through the first switch SWA.

That is, drive controller 51 is configured to determine whether at least one of the following first and second conditions is satisfied:

The first condition is that the output signal Sgsc1 of the second comparator 70B is the logical high level The second condition is that the output signal Sgsc2 of the third comparator 70C is the logical high level This configuration determines whether there is a short-circuit fault associated with the first and second switches SWA and SWB based on comparison between the first sense voltage VsA and the short-circuit threshold SC, which is earlier by time Td (see FIG. 8) than the drive circuit DrA that determines whether there is a short-circuit fault associated with the first and second switches SWA and SWB based on comparison between the sense average Vave and the short-circuit threshold SC.

This therefore enables whether there is a short-circuit fault associated with the switches SWA and SWB to be determined more rapidly.

Fourth Embodiment

Figure 9:
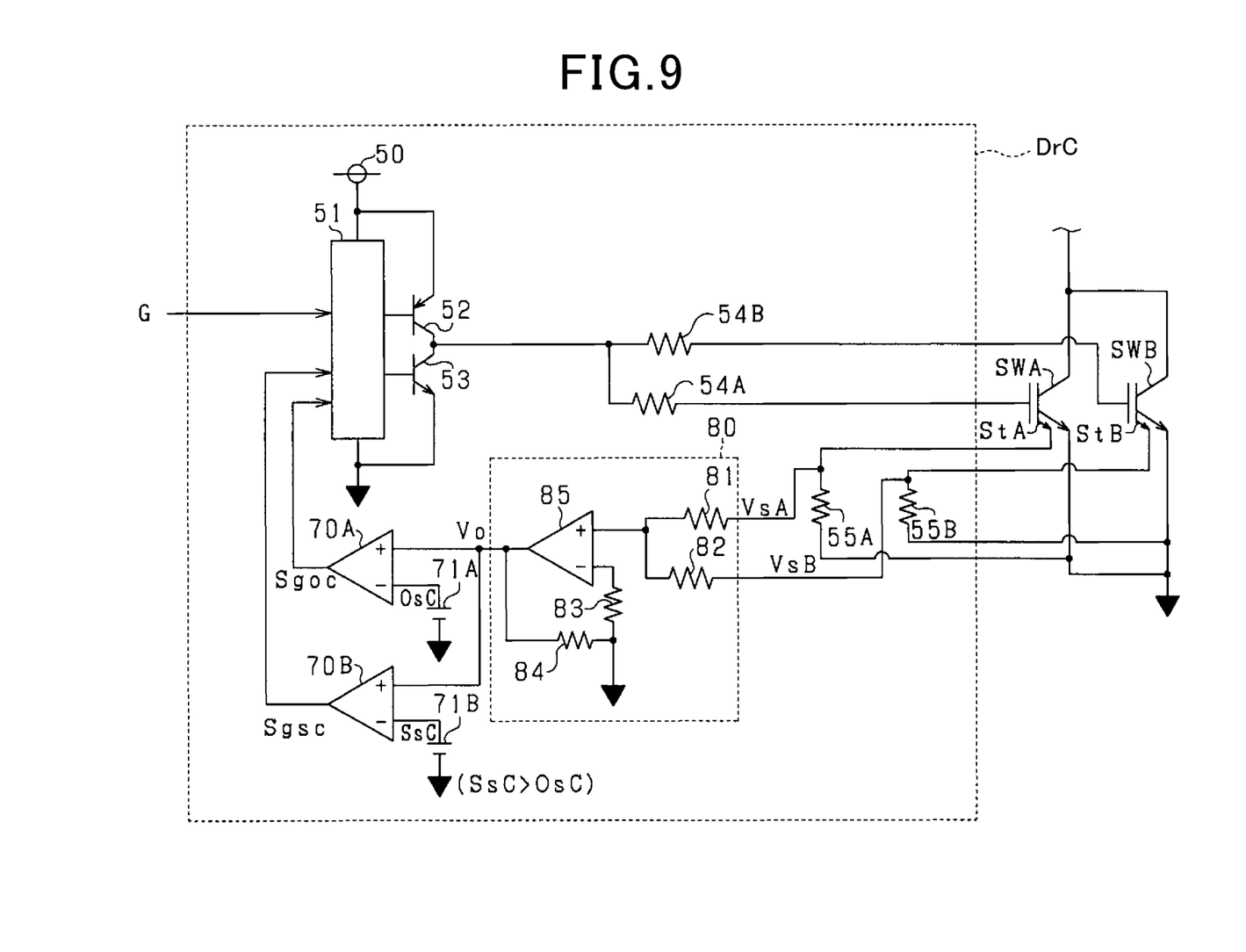
FIG. 9 is a circuit diagram schematically illustrating an example of the structure of a drive circuit for each switch unit according to the fourth embodiment of the present disclosure.

The following describes the fourth embodiment of the present disclosure with reference to FIG. 9. FIG. 9 schematically illustrates each drive circuit DrC according to the fourth embodiment. The structures and/or functions of the drive circuit DrC according to the fourth embodiment are different from those of the drive circuit Dr according to the first embodiment by the following points. So, the following mainly describes the different points, and omits or simplifies descriptions of like parts between the first and fourth embodiments, to which identical or like reference characters are assigned, thus eliminating redundant description.

The drive circuit DrC includes an adder 80 in place of the averaging circuit 60.

The adder 80, which serves as, for example, a determination voltage calculator, includes first to fourth resistors 81 to 84 and an operational amplifier 85 having a non-inverting input terminal, an inverting input terminal, and an output terminal. Each of the first to fourth resistors 81 to 84 has opposing first and second ends, and also has a corresponding one of resistances R1 to R4.

The first end of the first resistor 81 is connected to the first end of the first sense resistor 55A, and the first end of the second resistor 82 is connected to the first end of the second sense resistor 55B. The second end of each of the first and second resistors 81 and 82 is connected to the non-inverting input terminal of the operational amplifier 85.

The first end of the third resistor 83 is connected to the inverting input terminal of the operational amplifier 85, and the second end of the third resistor 83 is connected to the emitter of each of the first and second switches SWA and SWB via the common signal ground.

The output terminal of toe operational amplifier 85 is connected to the first end of the fourth resistor 84, and the second end of the fourth resistor 84 is connected to the emitter of each of the first and second switches SWA and SWB via the common signal ground.

The output terminal of the operational amplifier 85 is also connected to the non-inverting input terminal of each of the first and second comparators 70A and 70B.

The operational amplifier 85 is configured to output a sense additional value Vo to the non-inverting input terminal of each of the first and second comparators 70A and 70B.

That is, the operational amplifier 85 is configured to calculate the sense additional value Vo, which corresponds to, for example, a determination voltage, in accordance with the following equation (eq1):

$$Vo = \frac{R3 + R4}{R3} \cdot \frac{R2}{R1 + R2}(VsA + VsB) \tag{eq1}$$

The resistances R1 and R2 of the fourth embodiment are set to be equal to each other, and the resistances R3 and R4 of the fourth embodiment are also set to be equal to each other.

This setting enables the sense additional value Vo to be represented by the sum of the first sense voltage VsA and the second sense voltage VsB, which will be expressed by the following equation: Vo=(VsA+VsB).

To the inverting input terminal of the first comparator 70A, an output voltage of the first power source 71A is input as an overcurrent threshold OsC that is set to the sum of a first limit sense voltage of the first switch SWA and a second limit sense voltage of the second switch SWB; each of the first and second limit sense voltages is generated when a rated current for a corresponding one of the first and second switches SWA and SWB flows through the corresponding one of the first and second switches SWA and SWB.

The first comparator 70A of the fourth embodiment is configured to compare the sense additional value Vo with the overcurrent threshold OsC, and output the output signal Sgoc having (1) The logical low level when the sense additional value Vo is lower than the overcurrent threshold OsC, or (2) The logical high level (H) when the sense additional value Vo is equal o or higher than the overcurrent threshold OcC The drive circuit DrC according to the fourth embodiment obtains the same technical effects as those obtained by the drive circuit Dr according to the first embodiment.

Modification of the Fourth Embodiment

Replacing the coefficient $$\frac{R3 + R4}{R3} \cdot \frac{R2}{R1 + R2}$$

with a coefficient K, the equation (eq1) can be expressed by the following equation: Vo=K(VsA+VsB).

In other words, the coefficient K according to the fourth embodiment is set to 1.

In contrast, the coefficient K according to a modification of the fourth embodiment can be set to a positive value less than 1, or a positive value more than 1. In this modification, the product of the coefficient K and the overcurrent threshold OsC can be used as a new overcurrent threshold to be input to the inverting input terminal of the first comparator 70A. Similarly, in this modification, the product of the coefficient K and the short-circuit threshold SsC can be used as a new short-circuit threshold to be input to the inverting input terminal of the second comparator 70B.

Fifth Embodiment

Figure 10:
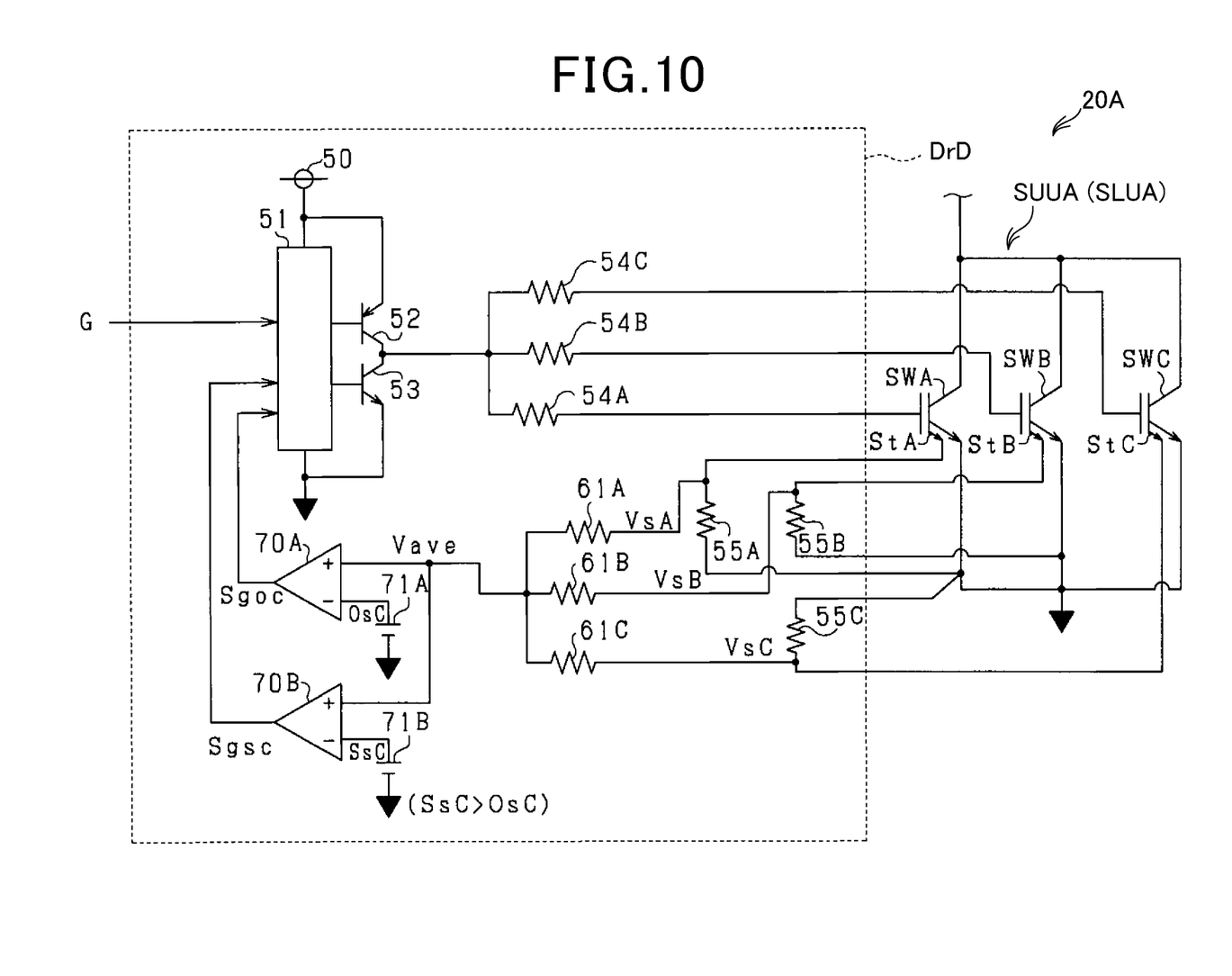
FIG. 10 is a circuit diagram schematically illustrating an example of the structure of a drive circuit for each switch unit according to the fifth embodiment of the present disclosure.

The following describes the fifth embodiment of the present disclosure with reference to FIG. 10. FIG. 10 schematically illustrates each drive circuit DrD according to the fifth embodiment. The structures and/or functions of the drive circuit DrD according to the fifth embodiment are different from those of the drive circuit DrA according to the second embodiment by the following points. So, the following mainly describes the different points, and omits or simplifies descriptions of like parts between the second and fifth embodiments, to which identical or like reference characters are assigned, thus eliminating redundant description.

FIG. 10 schematically illustrates an inverter 20A including three (UVW)-phase upper- and lower-arm switch units SUUA and SLUA. Each of the upper- and lower-arm switch units SUUA and SLUA for each phase is comprised of first to third switches SWA to SWC parally connected to each other, and similarly the lower-arm switch unit SLUA is comprised of first to third switches SWA to SWC parally connected to each other. Each of the upper- and lower-arm switch units includes a third flyback, i.e. free-wheeling, diode (not shown) connected in antiparallel to the third switch SWC, which is similar to the first and second switches SWA and SWB.

The first to third switches SWA to SWC have the same specifications, so that the designed on-resistances of the respective first to third switches SWA to SWC are set to be identical to each other.

The drive circuit DrD includes a third sense resistor 55C having a resistance RC, and a third averaging resistor 61C; each of the resistors 55C and 61C has opposing first and second ends.

The third switch SWC has a third sense terminal StC through which a minute current, i.e. a sense current, flows; the sense current is associated with a collector current flowing through the third switch SWC. The third sense terminal StC is connected to the first end of the third sense resistor 55C, and the second end of the third sense resistor 55C is connected to the emitter of the third switch SWC via the common signal ground. This enables the voltage drop across the third sense resistor 55C to be measured as a third sense voltage VsC.

The first end of the third sense resistor 55C is connected to the first end of the third averaging resistor 61C, and the second ends of the first to third averaging resistors 61A to 61C are commonly connected to each other, and also connected to the non-inverting input terminal of the first comparator 70A.

Assuming that the resistances RA to RC are equal to each other, the configuration of the drive circuit DrD enables the sense average Vave to be calculated in accordance with the following equation:

$$Vave=(VsA+VsB+VsC)\times\{RA/(RA+RB+RC)\}=(VsA+VsB+VsC)/3$$

This configuration therefore obtains the same technical effects as those obtained by the drive circuit DrA according to the second embodiment.

Modifications

The present disclosure is not limited to the above embodiments, and therefore the above embodiments can be freely combined with each other or variably modified within the scope of the present disclosure.

The drive circuit Dr according to the first embodiment is configured to synchronously turn on or off the first and second switches SWA and SWB, but the present disclosure is not limited to this configuration. Specifically, the drive circuit Dr can be configured to turn on or off one of the first and second switches SWA and SWB, and, after lapse of predetermined time, tun on or off the other thereof.

For example, the drive circuit Dr can be configured to turn on the first switch SWA, and, after lapse of the predetermined time, turn on the second switch SWB. In this example, the drive circuit Dr can be configured to prevent determination of whether there is an overcurrent flowing through the first switch SW during the predetermined time.

Each of the drive circuits Dr, DrA, and DrB can have the same configuration as the configuration of the drive circuit DrD according to the fourth embodiment if each of the switch units SUU and SLU has three or more switches parallely connected to each other.

Each of the switch units SUU and SLU can be comprised of switches having respectively different specifications. For example, each of the switch units SUU and SLU can be comprised of different types of switches, such as an IGBT and an N-channel MOSFET parallely connected to each other. If each of the switch units SUU and SLU can be comprised of two IGBTs and a MOSFET parallely connected to each other, the inventive concept of the present disclosure can be applied to the parallely connected IGBTs and MOSFET during the IGBTs are each used as a drive target.

Each of the switch units SUU and SLU can be comprised of four or more switches parallely connected to each other.

The present disclosure can be applied to other power converters except for inverters, such as DC-DC converters each having at least one of a voltage step-up function and a voltage step-down function.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. An overcurrent detection circuit for a plurality of switches parallely connected to each other, the overcurrent detection circuit comprising:
    a plurality of sense detectors respectively provided for the switches, each of the sense detectors being configured to detect a sense voltage of the corresponding one of the switches, the sense voltage of each of the switches being based on a sense current associated with a current flowing through the corresponding one of the switches;
    a parameter calculator configured to calculate, based on the sense voltages calculated by the respective sense detectors, a determination parameter that is less subject to imbalance between currents flowing through the respective switches; and
    a determiner configured to:
        determine whether a value of the determination parameter is higher than an overcurrent threshold; and
        determine that there is an overcurrent flowing through at least one of the switches upon determining that the value of the determination parameter is higher than the overcurrent threshold.

2. The overcurrent detection circuit according to claim 1, wherein:

the determination voltage calculator is configured to calculate, as the determination parameter, a determination voltage that comprises at least one of:
an average value of the sense voltages calculated by the respective sense detectors;
the sum of the sense voltages calculated by the respective sense detectors; and
a product of K and the sum of the sense voltages calculated by the respective sense detectors, K being a positive integer that is unequal to 1; and
the determiner configured to:
determine whether the determination voltage is higher than the overcurrent threshold; and
determine that there is an overcurrent flowing through at least one of the switches upon determining that the determination voltage is higher than the overcurrent threshold.

3. The overcurrent detection circuit according to claim 2, wherein:
the determination voltage calculator includes a plurality of resistors that are connected to the respective sense detectors and respectively have resistors, the determination voltage calculator being configured to calculate the product of the sum of the sense voltages and a predetermined ratio among the resistors to thereby calculate the average value of the sense voltages.

4. The overcurrent detection circuit according to claim 2, wherein:
the determination voltage calculator is configured to:
calculate the sum of the sense voltages; and
divide the sum of the sense voltages by the number of sense voltages to thereby calculate the average value of the sense voltages.

5. The overcurrent detection circuit according to claim 1, wherein:
the determiner is configured to:
determine whether the value of the determination parameter is higher than a short-circuit threshold that is set to be higher than the overcurrent threshold; and
determine that there is a short-circuit fault associated with the switches upon determining that the value of the determination parameter is higher than the short-circuit threshold.

6. The overcurrent detection circuit according to claim 1, wherein:
the determiner is configured to:
determine whether at least one of the sense voltages respectively detected by the sense detectors is higher than a short-circuit threshold that is set to be higher than the overcurrent threshold; and
determine that there is a short-circuit fault associated with the switches upon determining that at least one of the sense voltages respectively detected by the sense detectors is higher than the short-circuit threshold.

7. The overcurrent detection circuit according to claim 1, wherein:
each of the switches has a control terminal, charging the control terminals of the switches causes the switches to be turned on, and discharging the control terminals of the switches causes the switches to be turned off; and
the determiner is configured to determine whether the value of the determination parameter is higher than the overcurrent threshold during the switches being on,
the overcurrent detection circuit further comprising:
a fail-safe unit configured to discharge the control terminal of each of the switches upon it being determined that there is an overcurrent flowing through at least one of the switches due to it being determined that the value of the determination parameter is higher than the overcurrent threshold.

8. A drive circuit for a plurality of switches parallely connected to each other and each having a control terminal, the drive circuit comprising:
a charging and discharging unit configured to:
charge the control terminals of the switches to thereby cause the switches to be turned on; and
discharge the control terminals of the switches to cause the switches to be turned off;
a plurality of sense detectors respectively provided for the switches, each of the sense detectors being configured to detect a sense voltage of the corresponding one of the switches, the sense voltage of each of the switches being based on a sense current associated with a current flowing through the corresponding one of the switches;
a parameter calculator configured to calculate, based on the sense voltages calculated by the respective sense detectors, a determination parameter that is less subject to imbalance between currents flowing through the respective switches;
a determiner configured to:
determine whether a value of the determination parameter is higher than an overcurrent threshold during the switches being on; and
determine that there is an overcurrent flowing through at least one of the switches upon determining that the value of the determination parameter is higher than the overcurrent threshold; and
a fail-safe unit configured to discharge the control terminal of each of the switches upon it being determined that there is an overcurrent flowing through at least one of the switches due to it being determined that the value of the determination parameter is higher than the overcurrent threshold.

* * * * *